United States Patent [19]

Freyberger

[11] Patent Number: 4,460,850
[45] Date of Patent: Jul. 17, 1984

[54] DEFLECTION CIRCUIT FOR CATHODE-RAY TUBES

[75] Inventor: Laurin C. Freyberger, Bahlingen, Fed. Rep. of Germany

[73] Assignee: ITT Industries, Inc., New York, N.Y.

[21] Appl. No.: 258,501

[22] Filed: Apr. 28, 1981

[30] Foreign Application Priority Data

May 16, 1980 [DE] Fed. Rep. of Germany ....... 3018712

[51] Int. Cl.$^3$ .................... H01J 29/70; H01J 29/72
[52] U.S. Cl. ...................................... 315/367; 377/75
[58] Field of Search ............... 315/364, 367; 307/227, 307/228; 328/14; 377/75, 76

[56] References Cited

U.S. PATENT DOCUMENTS

| | | | |
|---|---|---|---|
| 3,421,046 | 1/1969 | Eychaner | 315/367 |
| 3,609,444 | 9/1971 | van den Heuvel | 315/367 |
| 3,626,076 | 12/1971 | Uchiyama | 328/14 |
| 4,321,548 | 3/1982 | Jeenicke et al. | 328/14 |

Primary Examiner—Theodore M. Blum
Attorney, Agent, or Firm—James B. Raden; Donald J. Lenkszus

[57] ABSTRACT

A deflection circuit is disclosed wherein squarewave clock pulses are applied to the input of an n-stage shift register, the series input of which is connected to a fixed potential, the decoder is a summing circuit having n inputs each of which is connected to a respective output of the n-stages of the shift register, the resetting input of the shift register is controlled by the last shift register stage and a deflecting means is controlled by a sawtooth signal resulting at the output of the summing circuit.

9 Claims, 4 Drawing Figures

# DEFLECTION CIRCUIT FOR CATHODE-RAY TUBES

FIELD OF THE INVENTION

The invention relates to deflection circuits for cathode-ray tubes which, with the aid of digital circuits controlled by a squarewave clock pulse generator, and decoders, produce a sawtooth signal.

Such deflection circuits are known for example, from the German Patent Application DE-OS No. 22 58 864. There, the digital circuits consist of a horizontal and of a vertical counter. The horizontal decoder decoding the counts of the horizontal counter, and the vertical decoder operating in like manner, control corresponding chains of JK flip-flops with the aid of which then the deflecting signals are generated.

SUMMARY OF THE INVENTION

It is the object of the invention, in starting out from the well known principle of the digital reconditioning of the sawtooth signal, to provide a deflection circuit which, owing to a clever selection of the partial circuits, is less expensive on the whole than the conventional arrangement. This is accomplished as follows. The squarewave clock pulse generator is applied to the clock pulse input of an n-stage shift register whose series signal input is applied to a fixed potential, with n indicating the number of resolution steps of the deflecting period, hence, e.g. the number of picture points in one television picture line, or the number of lines of one television field, the decoder is a summing (integrating) circuit having n inputs each of which is connected to a respective output of the n stages of the shift register, the resetting input of said shift register is controlled by the last shift register stage and the deflecting means are controlled by a sawtooth signal resulting at the output of said summing (integrating) circuit. Further developments and advantageous embodiments of the invention are described hereinafter.

BRIEF DESCRIPTION OF THE DRAWINGS

The invention will now be explained in greater detail with reference to FIGS. 1 to 4 of the accompanying drawings in which.

DESCRIPTION OF THE BEST MODE

Figure 1:
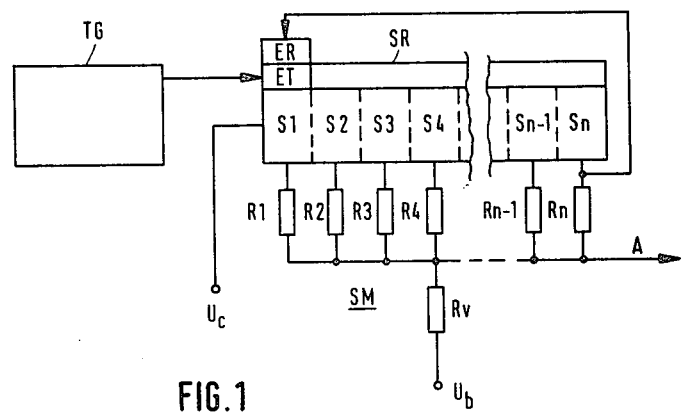
FIG. 1, in the form of a basic circuit diagram, shows a first type of embodiment of the invention.

In the basic circuit diagram of FIG. 1 the squarewave clock pulse generator TG is shown to supply the shift register SR via the clock pulse input ET thereof. This has n stages of which the stages S1, S2, S3, S4, Sn−1, Sn are shown. The input of the first stage S is the series signal input of the shift register SR and is applied to the fixed potential $U_c$. This fixed potential may correspond to one of the two binary signal levels H, L, so that on one hand, upon each clock pulse change into the first stage S1 there is always taken over the same binary signal level, hence for example, the H-level and, on the other hand, this level, at each clock pulse change "moves on" into the subsequently following shift register stages. Accordingly, after n clock pulse changes, this binary signal level is established in all stages.

The reset input ER of the shift register SR is connected to the output of the last stage Sn, in other words, when the level as predetermined by the potential $U_c$, reaches this stage, all stages of the shift register SR are reset to the state having the complementary binary signal level. During the next cycle of n clock pulse changes, the shift register SR is again, so to speak "filled up" with the binary signal level by starting from the first stage S1.

The number n is to be chosen thus as to correspond to the number of resolving steps of the deflecting period; accordingly, in the case of a deflection circuit for television receivers, it may correspond either to the number of picture points of a television picture line, or else to the number of lines of one television field.

To the outputs of the individual shift register stages S1 ... Sn there is connected as a summing circuit SM, in the example of embodiment as shown in FIG. 1, a resistance arrangement as described below. To each output of the n stages S1 ... Sn there is connected one of the resistors R1 ... Rn whose terminals not applied to the shift registers, are jointly connected across the series resistor Rv to the supply voltage $U_b$. The connecting point between the individual resistors R1 ... Rn and the series resistor Rv represents the output A for the sawtooth signal controlling the deflecting means of the cathode-ray tube.

Depending on the selected design of the shift register SR it may be necessary to provide between the outputs of the individual stages S1 ... Sn and the resistors R1 ... Rn, an electronic switch which is intended to safeguard that the binary signal levels at the output of the shift register stages, is nearly alike for all of the stages, and is lying in the proximity of the potential of the zero point of the circuit.

With respect to linearly extending edges of the sawtooth signal to be generated, the resistance values of the individual resistors R1 ... Rn, are to be chosen to be alike amongst each other.

Figure 2:
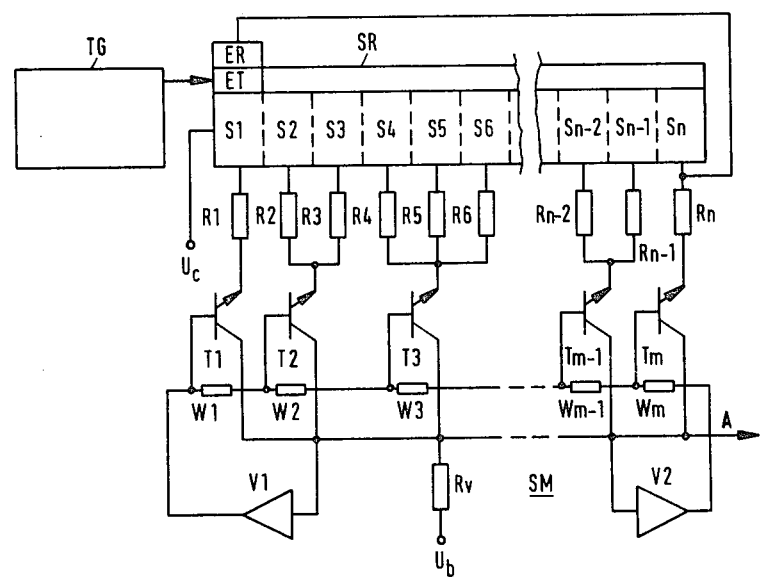
FIG. 2, by way of a basic circuit diagram, shows a further embodiment of the arrangement as shown in FIG. 1, by which the waveform of the sawtooth signal can be either adjusted or predetermined.

With the aid of the further embodiment of the arrangement according to FIG. 1, as shown in FIG. 2, it is possible to influence the waveform of the sawtooth signal and to predetermine a desired course of the waveform. This is important above all with respect to vertical deflection circuits of television receivers, because there the so-called tangent correction is required, which can be accomplished with the aid of the arrangement as shown in FIG. 2. In the example of embodiment according to FIG. 2, the summing (integrating) circuit SM likewise consists of resistors R1 ... Rn and the series resistor Rv, but in addition thereto there are still provided the transistors T1 ... Tm and the voltage divider consisting of the voltage-dividing resistors W1 ... Wm, as well as the two voltage amplifiers V1, V2. The principle of the arrangement as shown in FIG. 2 resides in that per resistor R1 ... Rn there is provided in the utmost one transistor T1 ... Tm, with the emitter or source thereof being connected to the associated resistor, and with the collector or drain thereof being connected to the collectors or drains of the other transistors, and with the common connecting point, across the series resistor Rv again being applied to the supply voltage $U_b$. Moreover, the base electrodes of the transistors T1 ... Tm are applied to the aforementioned voltage divider consisting of the resistors W1 ... Wm, i.e. in such a way that in the order of sequence of the individual transistors T1, T2, T3, Tm−1, Tm, the associated base electrode is respectively connected to successively following tapping points of the voltage divider. Thus, for example, the base of transistor T2 is applied to the point connecting the resistors W1, W2, the base of transistor T3 is applied to the point connecting the resistors W2, W3, and the base of transistor Tn* Wm−1, Wm.

* is applied to the point connecting the resistors.

This basic principle is modified in the example of embodiment as shown in FIG. 2, insofar as a corresponding transistor is not associated with each of the resistors R1 ... Rn, but that at least two successively following resistors, via one common transistor, are applied to the corresponding voltage-divider tap. Thus, the transistor T2 is associated with the two resistors R2, R3, the transistor T3 is associated with the resistors R4, R5, R6, and the transistor Tm−1 is associated with the resistors Rn−2, Rn−1. It will be seen that the current number m of the transistors T1 ... Tm and of the resistors W1 ... Wm, only with respect to the first mentioned case is equal to the current number n of the transistors R1 ... Rn, in which one transistor is associated with each resistor.

The waveform of the sawtooth signal is now predetermined not only by the selection of the resistance values of the resistors W1 ... Wm, but also by selecting the potential at the ends of the voltage divider, and by the course or connection thereof. In the example of embodiment of FIG. 2 it is shown that the two ends, via the two voltage amplifiers V1, V2, are connected to the common collector potential of the transistors T1 ... Tm. As such voltage amplifiers it is possible to use, for example, conventional emitter-follower stages—with the voltage gain thereby, of course, being somewhat smaller than unity—or any other suitable voltage amplifiers, such as correspondingly connected operational amplifiers. The selection of these possibilities for taking influence upon the waveform of the sawtooth signal is dependent upon the characteristic quantities of the employed picture tube and deflecting means, and may be left to the person skilled in the art to decide.

Figure 3:
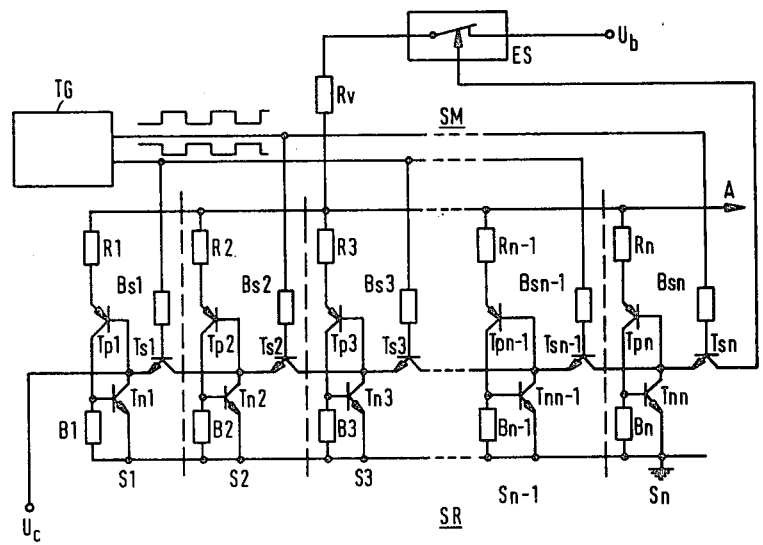
FIG. 3 shows the circuit diagram of a third type of embodiment relating to the shift register according to the invention.

FIG. 3 shows the circuit diagram relating to one possibility of realizing the individual shift register stages, in cases where the shift register is intended to be designed as a bipolar monolithic integrated circuit. The shift register stage S1 ... Sn consists substantially of a thyristorlike arrangement of two complementary transistors Tn1, Tp1 ... Tnn, Tpn.

From this FIG. 3 there can be seen that to the npn-transistor Tn1 ... Tnn, whose emitter is applied to the zero point of the circuit, there is associated the base resistor B1 ... Bn, which is arranged in parallel with the base-emitter path. The emitter of the pnp-transistor Tp1 ... Tpn is the respective output and, accordingly, connected to the respective resistors R1 ... Rn which, across the series resistor Rv, are again applied to the supply voltage $U_b$. For the already mentioned resetting of the shift register SR, it is shown as one possibility in FIG. 3, to apply the supply voltage $U_b$ via an electronic switch ES to the series resistor Rv, with said switch being closed during the aforementioned filling-up of the shift register, and is momentarily opened merely when the input signal has reached the last stage. Therefore, the control input of the electronic switch ES, in the example of the embodiment of FIG. 3, is correspondingly controlled by the last stage Sn.

Moreover, each of the stages S1 ... Sn is associated with the control transistor Ts1 ... Tsn, with the emitter thereof being connected to the collector of the npn-transistor and the base of the pnp-transistor of each stage, and with the collector thereof being connected to the same connecting point of the next successive stage; accordingly, the emitter-collector path of the control transistor serves to connect the "gate electrodes" of the thyristorlike arrangements among each other.

The aforementioned base-collector connection point of the first stage S1 is applied to the already mentioned constant potential $U_c$. Finally, to each of the control transistors Ts1 ... Tsn, there is still associated the base series resistor Bs1 ... Bsn, across which the individual stages S1 ... Sn are connected to the squarewave pulse generator TG. In the example of embodiment shown in FIG. 3, this is accomplished in such a way that the squarewave clock pulse generator TG transmits two antiphase clock signals, i.e., the two clock signals are phase-shifted with respect to one another by 180°. The odd-numbered stages S1, S3, Sn−1 are applied to the one clock signal, and the even-numbered stages S2, Sn are applied to the other clock signal.

Figure 4:
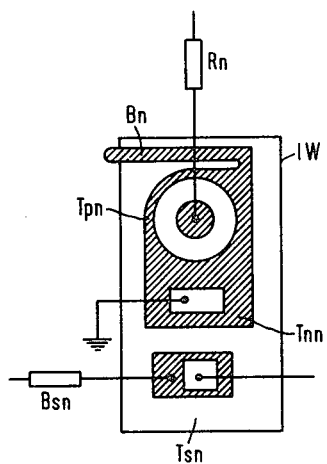
FIG. 4 shows the arrangement of the individual elements of the shift register as shown in FIG. 3 when realized as a bipolar-monolithic integrated circuit.

FIG. 4, finally, still shows how in the case of a bipolar monolithic realization, the individual shift register stage can be arranged in the semiconductor body of the integrated circuit. The two complementary transistors Tnn, Tpn, the base resistor Bn as well as the control transistor Tsn are shown to be arranged in one single insulating island IW, with the material thereof forming the collector regions of the control transistor Tsn and of the npn-transistor Tnn, as well as also the base region of the lateral pnp-transistor Tpn. In the case of the control transistor Tsn, the hatchlined regions represent the base region thereof, and in the case of the npn-transistor Tnn the hatchlined areas likewise represent the base region, while representing the collector region in the case of the pnp-transistor Tpn. The non-shaded area lying within the hatchlined area illustrates in the case of the control transistor Tsn and in the case of the npn-transistor Tnn each time the emitter regions thereof, and in the case of the lateral pnp-transistor Tpn, the base region. Within this annular or ring shaped non-shaded area there is again located the emitter region as indicated by the hatchlines, i.e. the emitter region of the lateral pnp-transistor Tpn. Moreover, it is still shown in FIG. 4 that the base resistor Bn of the npn-transistor Tnn may be designed to form a continuation of the base region thereof.

In the case of the aforementioned application of the deflection circuit according to the invention to television receivers in which the picture synchronizing pulse is derived by way of frequency division from the line synchronizing pulse with the aid of counters, it is particularly advantageous to employ the shift register at the same time to serve as such a counter. In that case, in addition to the connection of the shift register in the way as shown in FIGS. 1 to 3, there is still required a slight additional decoding arrangement with respect to some of the last stages of the shift register, as is already known from counters used for the aforementioned purpose.

The advantage of the invention resides in that both the shift register and the summing (integrating) circuit, compared with the aforementioned conventional arrangement, do with a substantially smaller amount of individual components, so that the space required on the semiconductor crystal in the case of an integrated form of realization, remains within certain limits and, at a certain crystal area, further functions of a television receiver may be accommodated thereon. Moreover, the deflection circuit according to the invention is not only suitable for being realized in accordance with the already mentioned bipolar integration technique, but also for integration in accordance with the well known MOS-technique.

I claim:

1. A deflection circuit comprising:
   a squarewave clock pulse generator;
   an n-stage serial input shift register, where n is the number of resolution steps of the deflection period, said shift register having a clock input coupled to said pulse generator, an input responsive to a reset signal for resetting each of the n stages to a first predetermined state, and a serial signal input, said serial input being coupled to a fixed potential such that each time said register receives a pulse at said clock input the first one of said n-stages is set to a second predetermined state, said register having n parallel outputs, each of said n outputs being the corresponding output of one of said n stages;
   means coupling the output of the nth stage to said reset input such that when said nth stage output is at said second predetermined state said reset signal is applied to said reset input;
   said decoder comprising a circuit having n inputs, each of said n inputs being coupled to a corresponding one of said n outputs, said circuit generating an output sawtooth signal having an instantaneous magnitude corresponding in value to the number of said n outputs which are at said second predetermined state; and
   deflecting means controlled by said sawtooth signal.

2. A deflection circuit in accordance with claim 1, wherein said decoder circuit comprises a summing circuit comprising n resistors each connected to a corresponding one of said n outputs and to a common point, a series resistor connected between said common point and a supply voltage, and an ouput for said sawtooth signal comprising said common point.

3. A monolithic integrated deflection circuit in accordance with claim 1, wherein said decoder circuit comprises a n resistors each connected to one of said n outputs and a plurality of transistors, with the emitter or source of each of said transistors being connected to at least one of said n resistors, and with the collectors or drains of all of said transistors being connected in common; and said deflection circuit comprises means for applying potential to the base or gate electrodes of said transistors for determining the course of said sawtooth signal as a function of time.

4. A deflection circuit in accordance with claim 3, wherein said voltage applying means comprises an ohmic voltage divider having taps, said base electrodes of said transistors being connected to successively following tapping points of said ohmic voltage divider; and two voltage amplifiers controlled by the common collector or drain potential of said transistors, and each having an output coupled a respective end of said divider.

5. A deflection circuit in accordance with claim 4, wherein at least one of said plurality of transistors is associated with at least two of said resistors.

6. A deflection circuit in accordance with claim 3, wherein at least one of said plurality of transistors is associated with at least two of said resistors.

7. A bipolar monolithic integrated deflection circuit in accordance with claims 2, 3, 4, 1 or 5, wherein each stage of said shift register comprises: two complementary transistors forming a thyristor structure; a base resistor connected to the base of the non-transistor and coupled together with the emitter of the non-transistor to the zero point of the circuit; and a control transistor having its emitter coupled to the point connecting the base of the pnp-transistor and the collector of the npn-transistor of the same stage, and having its collector coupled to the same connecting point of the successively following stage, and the emitter of said pnp-transistor of each stage is connected to one of said resistors; and a base series resistor connected to the base of said control transistor; and wherein the base series resistors of the even numbered stages of said shift register are applied to one output of said squarewave clock pulse generator and the base series resistors of the odd numbered stages are applied to a second output of said pulse generator, said pulse generator output and said second output providing two signals being opposite in phase with respect to one another.

8. A deflection circuit in accordance with claim 7, wherein, said two complementary transistors, said base resistor and said control transistor of each stage of said shift register are arranged in one common insulating island of a semiconductor body of said monolithic integrated circuit.

9. A deflection circuit in accordance with claims 2, 3, 4 or 1 for generating the vertical deflecting signal in television receivers in which the picture synchronizing pulse is derived from the line synchronizing pulse with the aid of counters, characterized in that said shift register also serves as such a counter.

* * * * *